US008482284B2

(12) United States Patent
Koay et al.

(10) Patent No.: US 8,482,284 B2
(45) Date of Patent: Jul. 9, 2013

(54) METHOD FOR DETERMINING AND ORDERING K-SPACE VIEWS AND DIFFUSION WEIGHTING DIRECTIONS

(75) Inventors: Cheng Guan Koay, Madison, WI (US); Samuel Anthony Hurley, Madison, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 251 days.

(21) Appl. No.: 13/175,059

(22) Filed: Jul. 1, 2011

(65) Prior Publication Data

US 2013/0002248 A1  Jan. 3, 2013

(51) Int. Cl.
*G01V 3/00* (2006.01)

(52) U.S. Cl.
USPC .......................................... 324/309; 324/307

(58) Field of Classification Search
USPC .................... 324/309, 307, 306, 300; 382/131
See application file for complete search history.

(56) References Cited

U.S. PATENT DOCUMENTS

| | | | |
|---|---|---|---|
| 7,358,730 B2 * | 4/2008 | Mistretta et al. | 324/307 |
| 8,055,048 B2 * | 11/2011 | Nielles-Vallespin et al. | 382/131 |
| 8,214,013 B2 * | 7/2012 | Shu et al. | 600/410 |
| 8,330,462 B2 * | 12/2012 | Poupon et al. | 324/309 |

OTHER PUBLICATIONS

Ahmad, et al., Quasi Monte Carlo-Based Isotropic Distribution of Gradient Directions for Improved Reconstruction Quality of 3D EPR Imaging, Journal of Magnetic Resonance, 2007, 184(2):236-245.
Deriche, et al., Optimal Real-Time Q-Ball Imaging Using Regularized Kalman Filtering with Incremental Orientation Sets, Medical Image Analysis, 2009, 13(4):564-579.
Dubois, et al., Optimized Diffusion Gradient Orientation Schemes for Corrupted Clinical DT1 Data Sets, Magnetic Resonance Materials in Physics, Biology and Medicine, 2006, 19(3):134-143.
Jones, et al., Optimal Strategies for Measuring Diffusion in Anisotropic Systems by Magnetic Resonance Imaging, Magnetic Resonance in Medicine, 1999, 42(3):515-525.
Rakhmanov, et al., Minimal Discrete Energy on the Sphere, Mathematical Research Letters, 1994, 1:647-662.
Saff, et al., Distributing Many Points on a Sphere, The Mathematical Intelligencer, 1997, 19:5-11.
Wong, et al., A Strategy for Sampling on a Sphere Applied to 3D Selective RF Pulse Design, Magnetic Resonance in Medicine, 1994, 32(6):778-784.

* cited by examiner

*Primary Examiner* — Louis Arana
(74) *Attorney, Agent, or Firm* — Quarles & Brady, LLP (57) ABSTRACT

A system and method for determining and ordering magnetic resonance imaging (MRI) acquisition parameters, such as k-space views or diffusion-weighting gradient directions, are provided. The MRI acquisition parameters are defined by generated points that are uniformly distributed on the surface of a sphere. These points may also be antipodally symmetric. The points are ordered by minimizing the electrostatic potential energy of different configurations of the points.

18 Claims, 5 Drawing Sheets

METHOD FOR DETERMINING AND ORDERING K-SPACE VIEWS AND DIFFUSION WEIGHTING DIRECTIONS

STATEMENT REGARDING FEDERALLY SPONSORED RESEARCH

This invention was made with government support under W81XWH-10-1-0739 awarded by the ARMY/MRMC. The government has certain rights in the invention.

BACKGROUND OF THE INVENTION

The field of the invention is systems and methods for magnetic resonance imaging ("MRI"). More particularly, the invention relates to systems and methods for calculating and selecting a k-space sampling pattern or diffusion gradient table.

The problem of constructing a set of uniformly-distributed points on the surface of a sphere has a long and interesting history, which dates back to J. J. Thomson in 1904, as described by J. J. Thomson in "On the Structure of the Atom: An Investigation of the Stability and Periods of Oscillation of a Number of Corpuscles Arranged at Equal Intervals Around the Circumference of a Circle; with Application of the Results to the Theory of Atomic Structure," *Philosophical Magazine*, 1904; 7(39):237-265. A particular variant of the Thomson problem that is of great importance to biomedical imaging is the problem of generating a nearly uniform distribution of points on the sphere via a deterministic scheme. Although the point set generated through the minimization of electrostatic potential based Coulomb's law is the gold standard, minimizing the electrostatic potential of one thousand or more points, or charges, remains a formidable task.

Therefore, a deterministic scheme capable of efficiently and accurately generating a set of uniformly-distributed points on the sphere has an important role to play in many biomedical and engineering applications, such as three-dimensional projection reconstruction of medical images, three-dimensional selective radiofrequency pulse design in MRI, and diffusion-weighting direction design and selection in diffusion MRI. Many deterministic schemes have been proposed in the past, including those described by E. Saff and A. Kuijlaars in "Distributing Many Points on a Sphere," *The Mathematical Intelligencer*, 1997; 19:5-11; by E. Rakhmanov, et al., in "Minimal Discrete Energy on the Sphere," *Mathematical Research Letters*, 1994; 1:647-662; and by R. Ahmad, et al., in "Quasi Monte Carlo-based isotropic distribution of gradient directions for improved reconstruction quality of 3D EPR imaging," *Journal of Magnetic Resonance*, 2007; 184(2):236-245.

The challenge remains, however, to provide a deterministic method for producing a uniform distribution of points on the surface of a sphere that is advantageous for medical imaging applications, such as those referred to above. Notably, for determining diffusion-weighting directions, the point set should present antipodal symmetry, which currently existing methods do not provide.

The importance and the effects of view-ordering on image quality in MRI has been studied extensively in many subfields, such as two-dimensional Cartesian acquisitions; radial fast spin echo ("FSE") acquisitions; and four-dimensional MR angiography with three-dimensional radial acquisitions. For example, the basic idea of FSE is to acquire multiple echoes within each excitation or within the same repetition time ("TR"). FSE acquisitions can provide for a significant reduction in scan time, which can be used to improve image resolution. However, the acquisition of multiple echoes within the same excitation comes at a cost of enhanced image artifacts, such as blurring or ringing because of $T_2$ decay, which produces signal modulations in k-space. Therefore, different view-ordering strategies have been developed and used in an effort to make the signal modulation as incoherent as possible in k-space.

Among the many studies on the relative merits of various diffusion gradient schemes, it is well accepted that the uniformity of the diffusion gradient schemes plays an important role in the final estimate of any diffusion MRI or diffusion tensor-derived quantities. It was first suggested by D. K. Jones, et al., in "Optimal Strategies for Measuring Diffusion in Anisotropic Systems by Magnetic Resonance Imaging," *Magnetic Resonance in Medicine*, 1999; 42(3):515-525, that the diffusion gradient vectors should be endowed with antipodal symmetry. Because diffusion MRI measurements are acquired sequentially with distinct unit gradient directions, it has been shown that different orderings, or sequences, of the gradient directions have different effects on the quality of tensor-derived quantities obtained from partial scans, or some subset of the complete measurements, as described, for example, by J. Dubois, et al., in "Optimized Diffusion Gradient Orientation Schemes for Corrupted Clinical DTI Data Sets," *Magnetic Resonance Materials in Physics, Biology and Medicine*, 2006; 19(3):134-143.

Even though several methods have been proposed to generate optimal orderings of gradient directions, the fact that these methods have not been in routine clinical use may be attributed to two major problems of computational inefficiency. The first problem is that the existing methods for generating highly uniform and antipodally symmetric points on the unit sphere are iterative and inefficient, which may take up to many minutes to several hours to complete, and yet without any clue of whether convergence has been achieved. The second problem is that previously proposed methods for generating optimal ordering of gradient directions are based upon simulated annealing, which takes on the order of 137 hours to generate the ordering for a set of 150 points, as mentioned, for example, by R. Deriche, et al., in "Optimal Real-Time Q-Ball Imaging using Regularized Kalman Filtering with Incremental Orientation Sets," *Medical Image Analysis*, 2009; 13(4):564-579.

It would therefore be desirable to provide a method for generating a set of points that are highly uniformly distributed on the surface of a sphere, and that exhibit antipodal symmetry, in a computationally efficient manner. Furthermore, it would be desirable to provide a method that determine optimal orderings of points in such a set of points for particular medical imaging applications, such as three-dimensional radial MRI and diffusion MRI.

SUMMARY OF THE INVENTION

The present invention overcomes the aforementioned drawbacks by providing a system and method for generating an ordering a highly uniform point set that defines acquisition parameters for magnetic resonance imaging ("MRI"). More particularly, the ordering of the points is optimized for the particular imaging task at hand. For example, when the point set defines diffusion-weighting directions, the point set is generated to be antipodally symmetric, which is advantageous for diffusion-weighted imaging applications.

It is an aspect of the present invention to provide a medical imaging system that includes a processor configured to generate a point set that defines magnetic resonance imaging ("MRI") acquisition parameters and that includes points that are substantially uniformly distributed on a surface of a sphere; and to determine an order in which points in the generated point set are to be temporally arranged by minimizing electrostatic energy potentials related to the points in the generated point set. The processor is in communication with an MRI system, which receives from the processor the generated point set and the determined order in which points in the generated point set are to be temporally arranged, and which is configured to acquire magnetic resonance image data in accordance with the MRI acquisition parameters defined by the generated point set and the determined order in which points in the generated point set are to be temporally arranged.

It is another aspect of the invention to provide a method for producing an image of a subject with an MRI system. MRI acquisition parameters are determined by generating a point set that defines the MRI acquisition parameters, the point set including points that are substantially uniformly distributed on a surface of a sphere. The MRI parameters are also determined by determining an order in which points in the generated point set generated are to be temporally arranged by minimizing electrostatic energy potentials related to the points. The MRI system is then directed to acquire k-space data from a subject using the determined MRI acquisition parameters and the order in which points in the generated point set are to be temporally arranged. From the acquired k-space data, an image of the subject is reconstructed.

The foregoing and other aspects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims and herein for interpreting the scope of the invention.

DETAILED DESCRIPTION OF THE INVENTION

A method for generating a point set for defining diffusion-weighting directions or three-dimensional radial k-space trajectories, and for determining optimal orderings of such directions or trajectories is provided. The generated point set is substantially uniform over the surface of a sphere and may display antipodal symmetry, which is advantageous for defining diffusion-weighting directions.

The methods of the present invention can generate highly uniform and antipodally symmetric points on the unit sphere, and can determine optimal orderings of diffusion-weighting gradient directions of comparable uniformity in less than a second for a sample size of several hundreds of points. Thus, the computational efficiency of the provided methods is about seven orders of magnitude faster than current methods.

Method for Generating Highly Uniform Point Set

Figure 1:
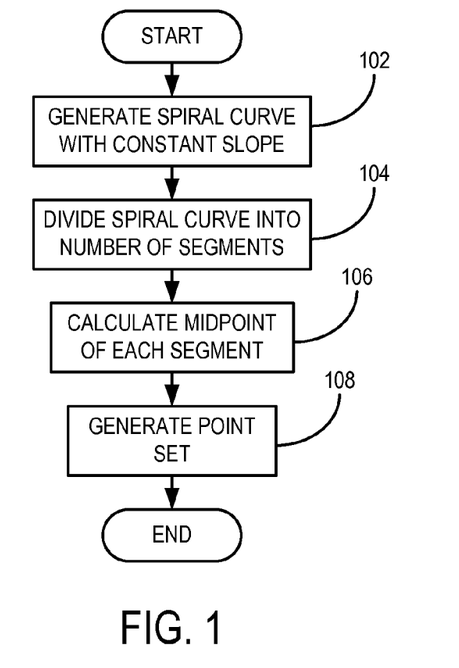
FIG. 1 is a flowchart setting forth the steps of an exemplary method for generating such a highly uniform point set.

First, a general method for generating a point set that is highly uniformly distributed on the surface of a sphere is provided. Referring now to FIG. 1, a flowchart setting forth the steps of an exemplary method for generating such a highly uniform point set is illustrated. As indicated at step 102, the first step in the generation of the point set is produce a spiral curve with a slope, $d\phi/d\theta$, that is set to a constant value, m. This step leads to the following relationship between the angular elements $\theta$ and $\phi$:

$$\phi = m\theta \quad (1).$$

A line element, ds, of the spiral can be expressed as:

$$ds = \sqrt{1 + \sin^2(\theta)\left(\frac{d\phi}{d\theta}\right)^2}\, d\theta. \quad (2)$$

By substituting Eqn. (1) into Eqn. (2), and integrating Eqn. (2), it can be seen that the length of a segment of the spiral curve can be described by the elliptic integral of the second kind, as shown below:

$$S_{\Theta_1}^{\Theta_2} = \int_{\Theta_1}^{\Theta_2} \sqrt{1 + m^2\sin^2(\theta)}\, d\theta \quad (3)$$
$$= E(\Theta_2 \mid -m^2) - E(\Theta_1 \mid -m^2);$$

where:

$$E(\phi \mid m) = \int_0^\phi \sqrt{1 - m\sin^2(\theta)}\, d\theta; \quad (4)$$

and:

$$E(m) = \int_0^{\frac{\pi}{2}} \sqrt{1 - m\sin^2(\theta)}\, d\theta. \quad (5)$$

Note also that E(m) is known as the complete elliptic integral of the second kind. Thus, the total length of the spiral curve is given by $2E(-m^2)$, or:

$$S_0^\pi = 2E(-m^2) \quad (6).$$

As indicated at step 104, the nest step in generating the point set is to divide the spiral curve into n segments of equal length, which is denoted $S_0^\pi/n$, and then to collect the center point of each segment along the spiral curve as an element of the desired point set. To ensure that the spacing between adjacent turns of the spiral curve is not too close or too wide, the spacing between adjacent turns of the spiral curve will be set to be equal to the length of a segment. This construction can be viewed from the point of view of keeping the area enclosed by a segment and the spacing between adjacent turns of the spiral curve to be nearly equal for every segment. Due to the simple relationship in Eqn. (1), the this spacing turns out to be $2\pi/m$ because as the spiral makes a complete turn, $\phi$ completes a cycle, which is $2\pi$. Therefore, the following criterion exists:

$$\frac{2\pi}{m} = \frac{S_0^\pi}{n}; \quad (7)$$

or, $$m = \frac{2n\pi}{S_0^\pi} \quad (8)$$
$$= \frac{n\pi}{E(-m^2)}.$$

It is interesting to note that Eqn. (8) is a fixed point formula for m and can be solved directly. Specifically, define $$g(m) = \frac{n\pi}{E(-m^2)}; \quad (9)$$

and iterate the function, g(m), on itself such that:

$$|g^i(m_0) - m_{i-1}| < \epsilon \quad (10);$$

for some nonnegative integer, i, and a small fixed positive number, $\epsilon$, such as $\epsilon = 1.0 \times 10^{-8}$. Note that $g^1$ denotes composition of the function, g, i number of times. That is:

$$g^i(m_0) = g(\ldots(g(g(m_0)))) \quad (11).$$

Iterative schemes benefit from good initial values. Here, the asymptotic form of the solution, which is $m \sim \sqrt{n\pi}$, may be used as an initial value because $E(-m^2)$ is asymptotically equal to m for large values of m. A robust iterative method, such as Newton's method, may be used to more efficiently estimate values of m.

As indicated at step 106, the midpoint of each segment is then calculated. Based on the criterion stated above, the length of each segment is known to be $2\pi/m$. Following from the expression for the segment length in Eqn. (3) above, the midpoint of the segment may be given by:

$$\Theta_j = E^{-1}\left(\frac{\pi(2j-1)}{m} \mid -m^2\right); \quad (12)$$

for $j=1, \ldots, n$, and where $E^{-1}(\ldots)$ denotes the inverse of the elliptic integral. In solving the nonlinear equation in Eqn. (12), the following initial values may be used:

$$\Theta_j = \cos^{-1}\left(1 - \frac{2j-1}{n}\right). \quad (13)$$

The nonlinear equation can then be solved using, for example, Newton's method for root-finding.

Thus, as indicated at step 108, the foregoing information is used to generate a point set that is highly uniformly distributed on the surface of the sphere.

Method for Generating Highly Uniform and Antipodally Symmetric Point Set

Deterministic schemes for generating highly uniform points on the unit sphere have been proposed, but not for generating such points sets that also exhibit antipodal symmetry. Generally, a point set, S, is said to have antipodal symmetry if the unit vectors x and −x are both members of the point set, S.

Figure 2:
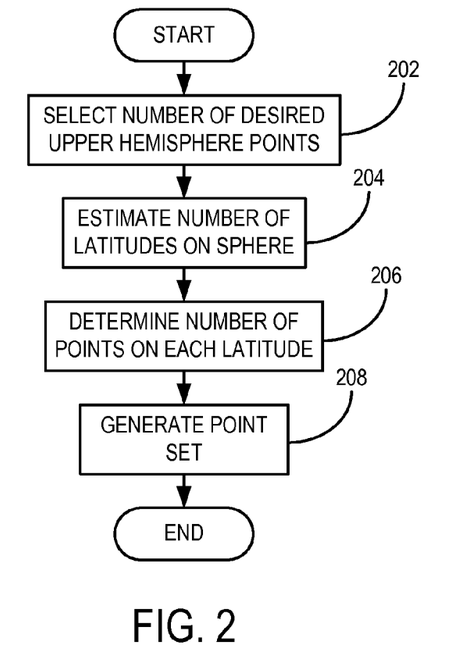
FIG. 2 is a flowchart setting forth the steps of an exemplary method for generating an antipodally symmetric point set that is highly uniformly distributed on the surface of a sphere.

Referring now to FIG. 2, a flowchart setting forth the steps of an exemplary method for generating a point set that is highly uniformly distributed on the surface of a sphere, and that exhibits antipodal symmetry, is illustrated. The basic idea for generating a uniform point set on the unit sphere with antipodal symmetry is based upon the notion that the spacing between two consecutive points on the same latitude should be equal to the spacing between two consecutive latitudes. Furthermore, it is advantageous to estimate the number of points needed for each equally spaced latitude on the upper hemisphere so as to make the complete set of points as uniformly distributed on the upper hemisphere as possible.

By way of example, a number, N, of desired points on the upper hemisphere of the unit sphere is selected first, as indicated at step 202. The total length, L, of the curve on which the points are placed is the sum of the circumference of all the latitudes, which is given by:

$$L = 2\pi \sum_{i=1}^n \sin(\theta_i) = \pi \csc\left(\frac{\pi}{4\hat{n}}\right); \quad (14)$$

where n is the number of latitudes, which needs to be estimated; and $\theta_i$ are polar angles, which are defined as:

$$\theta_i = \left(i - \frac{1}{2}\right)\frac{\pi}{2\hat{n}}; \quad (15)$$

with $i=1, \ldots, \hat{n}$, and where $\hat{n}$ denotes the estimated number of latitudes, n. The number of latitudes on the sphere is estimated next, as indicated at step 204. By equating the spacing of the latitudes, which is $\pi/2n$, and the spacing between points, which is L/N, the following nonlinear equation for the unknown number of latitudes, n, is achieved:

$$n = \frac{N}{2}\sin\left(\frac{\pi}{4n}\right). \quad (16)$$

Since the number of latitudes, n, increases with the number of points, N, the asymptotic form of Eqn. (16) can be found, for example, by keeping the first term in the Taylor series expansion of the sine function in Eqn. (16) with respect to n. The solution can then be rounded to the nearest integer, which is given by:

$$\hat{n} = \text{round}\left(\sqrt{\frac{N\pi}{8}}\right); \quad (17)$$

where round ( . . . ) is a rounding function, which may include a floor function, a ceiling function, a truncation function, or any other suitable function that rounds a numerical value to the nearest integer. Although Eqn. (17) is derived from the asymptotic expression when N is large, it turns out that the solution provided by Eqn. (17) works well even when N is as low as ten. However, in terms of uniformity of the point set, it is contemplated that the proposed point set is most beneficial when the desired number of points is greater than twenty. Point sets with a small sample size can be found through iterative methods, such as the Nelder-Mead simplex optimization.

Next, the number of points on each latitude is determined, as indicated at step 206. Let $k_i$ be the number of points at the latitude, $\theta_i$; it can be shown that $k_i$ is given by the following expression:

$$k_i = \begin{cases} N \cdot \dfrac{2\pi \sin(\theta_i)}{\pi \csc\left(\dfrac{\pi}{4\hat{n}}\right)}, & 1 \le i \le \hat{n} \\ N - \sum_{j=1}^{\hat{n}-1} k_j, & i = \hat{n}. \end{cases} \quad (18)$$

Therefore, the point set on the upper sphere is given by the following expressions in spherical coordinates, $(\theta_i, \phi_{i,j})$:

$$\theta_i = \left(i - \frac{1}{2}\right)\frac{\pi}{2\hat{n}}; \quad (19)$$

$$\phi_{i,j} = \left(j - \frac{1}{2}\right)\frac{2\pi}{k_i}; \quad (20)$$

with $i=1, \ldots, \hat{n}$ and $j=1, \ldots, k_i$. It should be noted that the transformation from spherical coordinates to Cartesian coordinates is based on the following expressions:

$$x = \sin(\theta)\cos(\phi) \quad (21);$$

$$y = \sin(\theta)\sin(\phi) \quad (22);$$

$$z = \cos(\theta) \quad (23).$$

Thus, as indicated at step 208, the foregoing information is used to generate a point set that is highly uniformly distributed on the surface of the sphere, and that exhibits antipodal symmetry.

Method for 3D Radial K-Space View Ordering

A method is now provided for optimally ordering a point set generated in one of the preceding manners for when that point set is used to define three-dimensional radial k-space sampling trajectories. Suppose that there are N points that are uniformly distributed on the unit sphere, and that N is a composite number, such as N=m×n. Visually, these points can be displayed on an m×n grid, or stored in a table or matrix of m rows and n columns, such as:

$$M = \begin{pmatrix} s_1 & \cdots & s_n \\ \vdots & \ddots & \vdots \\ s_m & \cdots & s_N \end{pmatrix}. \quad (24)$$

Note that the sequence, $\{s_1, s_2, s_3, \ldots, s_N\}$, may be taken to be any permutation of the original sequence, $\{1, 2, 3, \ldots, N\}$, of points. For three-dimensional radial fast spin-echo ("FSE") acquisitions, each column can be viewed as one excitation, and within the same column, each row can be viewed as a successive echo train. Therefore, in this instance, the echo train length ("ETL") is m and the number of echo trains, or excitations, is n.

A novel optimality criterion for achieving optimal view-ordering for three-dimensional radial MRI is provided herein. This criterion minimizes the sum of all of the electrostatic potential energies along the rows and along the columns of the matrix, M, noted above. The optimality criterion can be expressed as follows:

$$\Phi = \sum_{j=1}^{n} \phi_R(j) + \sum_{q=1}^{m} \phi_C(q); \quad (25)$$

where:

$$\phi_R(j) = \sum_{i=1}^{m-1} \sum_{k=i+1}^{m} \frac{1}{\|P_{ij} - P_{kj}\|}; \quad (26)$$

and:

$$\phi_C(q) = \sum_{r=1}^{n-1} \sum_{s=r+1}^{n} \frac{1}{\|P_{qr} - P_{qs}\|}. \quad (27)$$

It is noted that $P_{ij}$ is the point located at the $i^{th}$ row and $j^{th}$ column of the matrix, M. The function $\phi_R(j)$ denotes the electrostatic potential energy of all the points in different rows, but along the same $j^{th}$ column. Similarly, $\phi_C(q)$ denotes the electrostatic potential energy of all the points in different columns, but along the same $q^{th}$ row. In brief, minimizing $\Phi$ in Eqn. (25) entails simultaneously minimizing both $\phi_R(j)$ and $\phi_C(q)$.

It should be mentioned that the foregoing minimization is not an optimization of a function with continuous variables; rather, it is a combinatorial optimization that requires swapping of points to achieve a lower $\Phi$ value. As an aside, for the case when m is not equal to n, the number of distinct configurations is:

$$\frac{(m \cdot n)!}{m! n!}. \quad (28)$$

For example, the number of distinct configurations for m=128 and n=50, which is typical in MR applications, is on the order of $1 \times 10^{21,302}$. Thus, the task of finding the most optimum configuration for three-dimensional radial view ordering is very computationally challenging.

An exhaustive search of all the distinct configurations is infeasible; thus, an appropriately tailored search algorithm is desired. Before discussing the details of such an algorithm, some of the techniques that can speed up the search significantly are presented. Because the distances between points will never change, the value of all the inverse distances:

$$\frac{1}{\|P_{ij} - P_{kj}\|}; \quad (29)$$

may be computed and stored in a matrix having the following structure:

$$M = \begin{pmatrix} 0 & \frac{1}{\|P_2 - P_1\|} & \cdots & \frac{1}{\|P_N - P_1\|} \\ \frac{1}{\|P_1 - P_2\|} & 0 & \cdots & \frac{1}{\|P_N - P_2\|} \\ \vdots & \vdots & \ddots & \vdots \\ \frac{1}{\|P_1 - P_N\|} & \frac{1}{\|P_2 - P_N\|} & \cdots & 0 \end{pmatrix}. \quad (30)$$

Note that the single-index, 1, ..., N, and the double-index, (i,j), (k,j), (q,r), or (q,s) can be interchangeably used because the mapping between these two index sets is simple to construct.

Having described an advantageous criterion for determining an optimal three-dimensional radial view ordering, an algorithm for estimating the optimal view ordering is now provided.

Figure 3:
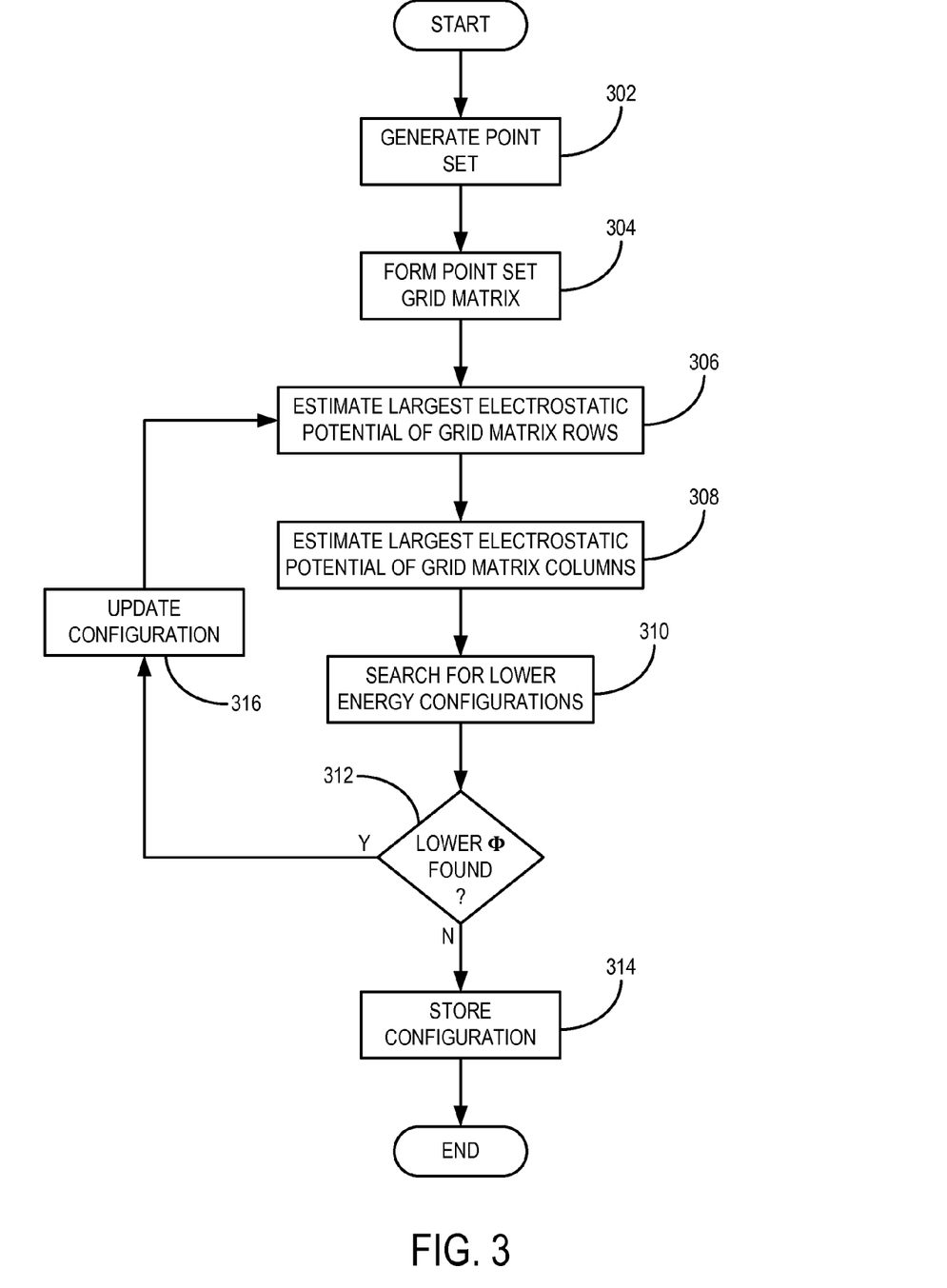
FIG. 3 is a flowchart setting forth the steps of an exemplary method for determining an optimal view ordering for three-dimensional radial k-space trajectories.

Referring now to FIG. 3, a flowchart setting forth the steps of an exemplary method for determining an optimal view ordering for three-dimensional radial k-space trajectories is illustrated. The method begins with the generation of a point set, from which the trajectories will be constructed, as indicated at step 302. For example, methods such as those described above can be used to generate the desired point set. Next, a permutation, such as a random permutation, is employed to fill the sequence on a grid, as illustrated at step 304.

Next, the largest electrostatic potentials of the rows and columns of the formed grid are estimated, as indicated at steps 306 and 308, respectively. For example, Eqn. (26) is used to identify the index, j, in the set $\{1,2,\ldots,n\}$ that results in the largest electrostatic potential, $\phi_R(j)$, and Eqn. (27) is used to identify the index, q, in the set $\{1,2,\ldots,m\}$ that results in the largest electrostatic potential, $\phi_C(q)$. The identified indices are stored as j* and q*, respectively. Lower energy configurations of Φ are then searched for, as indicated at step 310. For example, a lower energy configuration may be searched for by swapping $P_{ij}$ with $P_{q^*j^*}$, except for when i=q* and when j=j*. A decision is then made at decision block 312 whether a lower energy configuration was found. If a lower energy configuration is not found in the search then the configuration, Φ, that is calculated using the electrostatic potentials estimated in steps 306 and 308 is kept, as indicated at step 314. However, is a lower energy configuration was found, then the Φ is updated at step 316, and steps 306-310 are repeated to determine whether a still lower energy configuration can be found.

It should be noted that there are many modifications that can be made to the foregoing algorithm. For example, if the decision made at decision block 312 is that the lowest energy configuration, Φ, has been found, additional point swaps can be made to look for still better configurations. For example, a point, $P_{q^*r}$, that maximizes the following inner sum:

$$\sum_{s=1}^{n} \frac{1}{\|P_{q^*r} - P_{q^*s}\|}; \quad (31)$$

can be searched for. Similarly, a point, $P_{ij^*}$, that maximizes the following inner sum:

$$\sum_{\substack{k=1 \\ k \neq i}}^{m} \frac{1}{\|P_{ij^*} - P_{kj^*}\|}; \quad (32)$$

can also be searched for. Then, each point can be successively swapped with all other points in the grid matrix to search for a better configuration.

When completed, the stored configuration can be provided to an MRI system and used to design an appropriate pulse sequence for the acquisition of k-space data.

Method for Generating Optimal Ordering of Diffusion Gradient Directions

A method is now provided for optimally ordering a point set generated in one of the preceding manners, particularly for when that point set is used to define diffusion-weighting directions for diffusion MRI. The motivation behind the ordering of diffusion gradient directions is driven by practical considerations. Optimal ordering of diffusion gradient directions plays an important role in salvaging as much information as possible from partially completed diffusion MRI scans, such as in the event that the scan has to be interrupted unexpectedly. Therefore, the succeeding method of achieving optimal ordering of diffusion gradient directions is based on the idea that each subset of incremental sample size, which is derived from the prescribed and full set of gradient directions, should be as uniform as possible in terms of the modified electrostatic energy designed for an antipodally symmetric point set. The provided approach to solving this problem is deterministic and extremely efficient, and can be shown to be on the order of $O(N^2)$.

Figure 4:
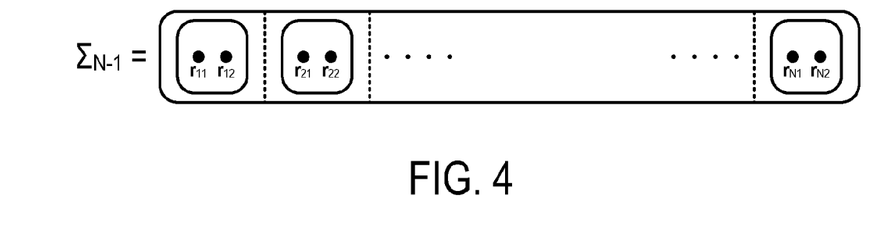
FIG. 4 is a pictorial representation of a point-set array that contains N pairs of points.

First, we shall introduce certain graphical representations to facilitate our discussion of the proposed method. FIG. 4 shows an exemplary sequence of pairs of points, which may be stored as a point set array, $\Sigma_{N-1}$. Each pair consists of a point, $r_{i1}$, for some $i \in \{1, \ldots, N\}$ and its antipodal counterpart, $r_{i2}$, where $r_{i1} = -r_{i2}$. The points $r_{i1}$ may be obtained from the deterministic scheme discussed above. The goal of this ordering method is to obtain subsets of incremental sample size, such as two-pair subsets, three-pair subsets, and so on, until a full set that is optimal in terms of electrostatic energy is formed.

Defining:

$$m_i = \frac{1}{\|r_{i1} - r_{i2}\|} = \frac{1}{2}; \quad (33)$$

it can be shown that the electrostatic energy, $\Omega_{ij}$, between two pairs of points, $(r_{i1}, r_{i2})$ and $(r_{j1}, r_{j2})$, is given by:

$$\Omega_{ij} = m_i + C_{ij} + m_j \quad (34);$$

where $C_{ij}$ is the energy of the cross-term, which is given by:

$$C_{ij} = \frac{2}{\|r_{i1} - r_{j1}\|} + \frac{2}{\|r_{i1} + r_{j1}\|}; \quad (35)$$

or by:

$$C_{ij} = \frac{2}{\|r_{i1} - r_{j1}\|} + \frac{2}{\sqrt{4 - \|r_{i1} - r_{j1}\|^2}}. \tag{36}$$

Although Eqns. (35) and (36) are equivalent mathematically, it is computational more efficient to use Eqn. (36) because it is a function of only one term, $\|r_{i1}-r_{j1}\|$. More importantly, it should be clear that significant computational efficiency can be gained by keeping the values of $C_{ij}$ rather than those of the coordinates of $r_{i1}$ in computer memory.

Figure 5:
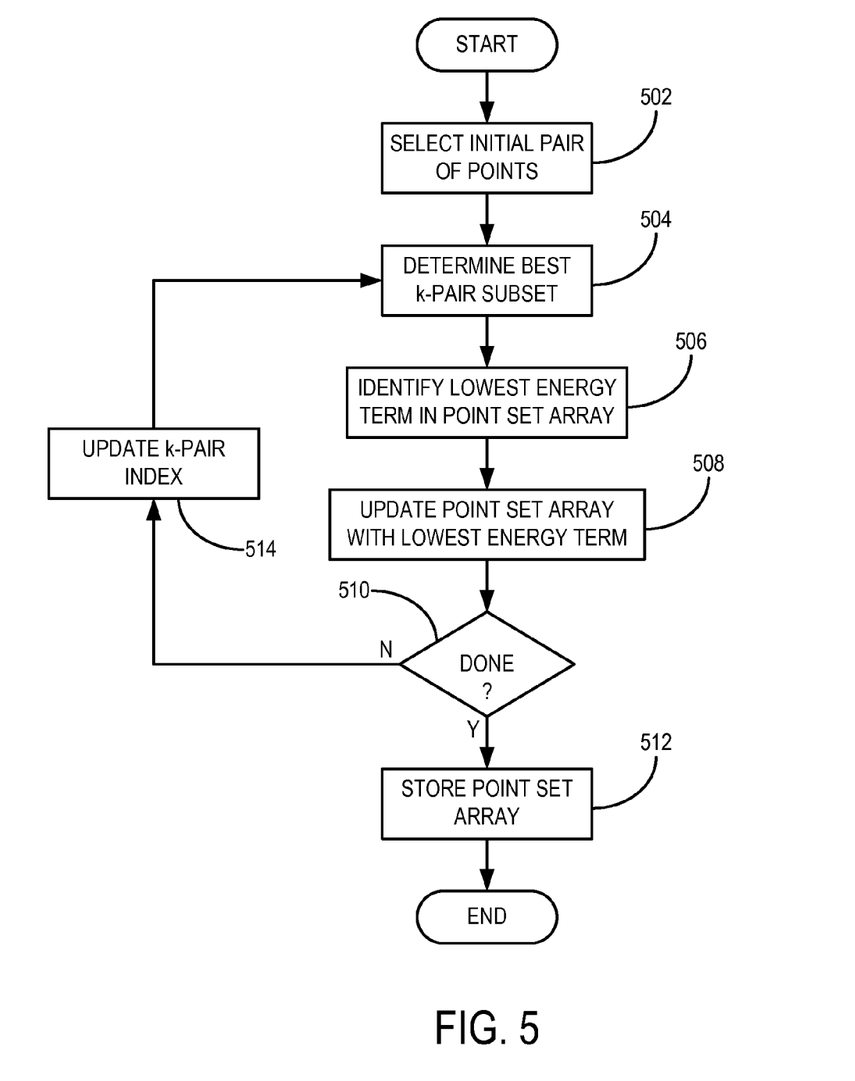
FIG. 5 is a flowchart setting forth the steps of an exemplary method for determining an optimal ordering for diffusion-weighting gradient directions.

Referring now to FIG. 5, a flowchart setting forth the steps of an exemplary method for determining an optimal ordering for diffusion-weighting gradient directions is illustrated. First, an initial pair of points is selected, as indicated at step 502. Following the selection of the initial pair of points, the best two-pair subset is determined, as indicated at step 504. This may be achieved, for example, using an N-dimensional array, $\Sigma_i$, with $i=1, \ldots, N$ to keep track of all the updates in energy computation. The first point set array, $\Sigma$, denoted by $\Sigma_0$, is defined as:

$$\Sigma_0 = [m_1, m_2, \ldots, m_N] \tag{37}$$

where $m_1$ is the pair of points selected in step 502. To find the best two-pair subset, $\Sigma_0$ is updated to obtain $\Sigma_1$ by adding the cross-terms, $C_{1j}$ from $j=2, \ldots, N$ as follows:

$$\Sigma_1 = [m_1, (m_2+C_{12}), (m_3+C_{13}), \ldots, (m_N+C_{1N})] \tag{38}$$

The lowest energy term is then located in $\Sigma_1$, as indicated at step 506. When identifying the lowest energy term, the first term, $m_1$, is not taken into consideration. Then, the lowest energy term and its corresponding pair of points is swapped with the second term in $\Sigma_1$, $(m_2+C_{12})$, and the second pair of points, respectively, as indicated at step 508.

A decision is then made at decision block 510 as to whether it is desirable to determine additional point pair subsets. If not, then the determined point pair subsets are stored as the diffusion gradient direction ordering, as indicated at step 512. Otherwise, the next pair subset is determined by updating the k-pair index, as indicated at step 514, and repeating steps 504-508 with the appropriate changes. For example, the best three-pair subset that includes the best two-pair subset as its member is determined. Similar to step 504, $\Sigma_1$ is first updated to obtain the point set array $\Sigma_2$ by adding the cross terms, $C_{2j}$, from $j=3, \ldots, N$:

$$\Sigma_2 = [m_1, (m_2+C_{12}), (m_3+C_{13}+C_{23}), \ldots, (m_N+C_{1N}+C_{2N})] \tag{39}$$

The lowest energy term in $\Sigma_2$ is then located without taking into consideration the previously established terms, which here are the first and second terms, $m_1$ and $(m_2+C_{12})$. Again, the lowest energy term and its corresponding pair of points is swapped with the third term in $\Sigma_2$ and the third pair of points, respectively.

The above procedure can be continued to find larger and larger subsets that are the best among their respective classes until the final desired set, $\Sigma_{N-1}$, is reached. In general, when determining the k-pair subset, the cross terms, $C_{kj}$, from $j=k, \ldots, N$ are added to the previous point set array, $\Sigma_{k-1}$, to form the current point array set, $\Sigma_k$. The lowest energy term is then located in the current point array set, $\Sigma_k$, without taken into consideration the first $k-1$ terms in the array. The lowest energy term is then swapped with the $k^{th}$ term of the point set array, $\Sigma_k$, as are the respective points associated with that term. It is interesting to note that the electrostatic energy of each subset is contained in $\Sigma_{N-1}$. Specifically, the electrostatic energy of the k-pair subset is given by:

$$\varepsilon_k = \sum_{i=1}^{k} (\Sigma_{N-1})_i; \tag{40}$$

where $(\Sigma_{N-1})_i$ indicates the $i^{th}$ component of $\Sigma_{N-1}$.

Ordering for Diffusion Gradient Directions with Multiple B-Values

Figure 6A:
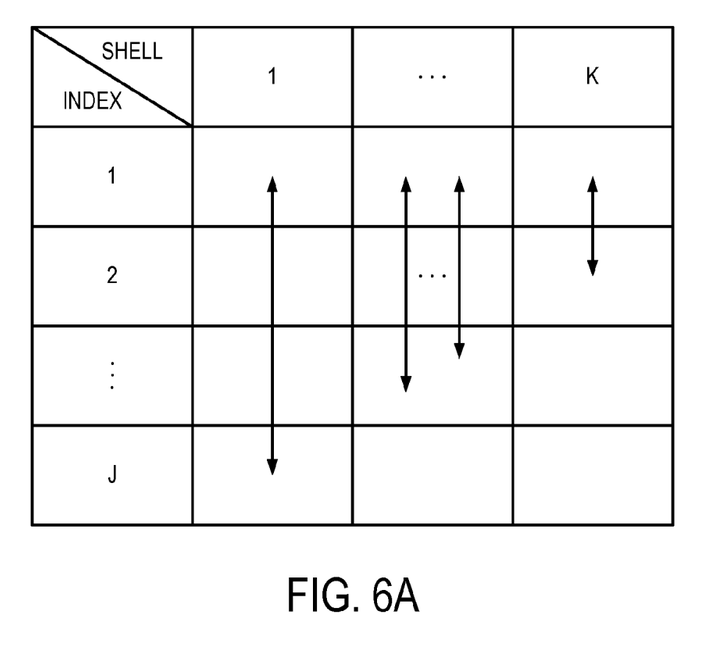
FIGS. 6A and 6B illustrate an exemplary scheme for ordering diffusion-weighting gradient directions across multiple shells of different b-values.
Figure 6B:
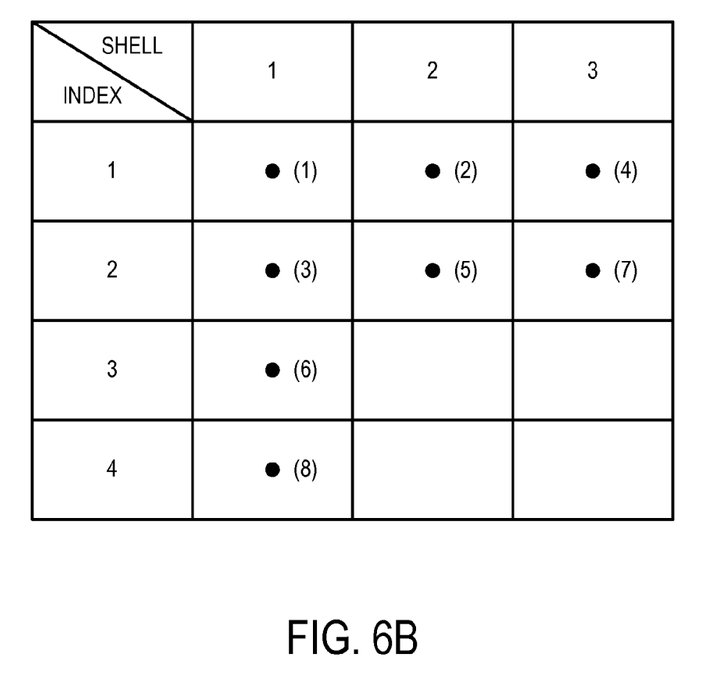

Increasingly, diffusion MRI measurements are acquired in a three-dimensional grid, or in multiple spherical shells. In the case of multiple spherical shells with different b-values, the foregoing ordering scheme can be used for each shell. Then, an additional ordering scheme, such as diagonal or Cantorian ordering, can be used to traverse across different shells. An exemplary scheme for further ordering the diffusion-weighting directions across multiple shells of different b-values is illustrated in FIGS. 6A and 6B.

Under the simple and special condition of every shell having the same number of points with $J \geq K$, it can be shown that the $(t)^{th}$ point under the Cantorian ordering can be expressed in terms of its corresponding Cartesian indices of $p^{th}$ row and $q^{th}$ column in the following expressions:

$$t(p, q) = \begin{cases} \frac{1}{2}(p+q)\omega - q + 1, & \omega \leq K \\ 1 - \frac{K(K+1)}{2} + Kp - q + Kq, & K < \omega \leq J \\ \frac{1}{2}\begin{pmatrix} 2p - 2J + \omega(p+q) - \\ (\omega - J)(p+q-J) - \\ (\omega - K)(p+q-K) \end{pmatrix}, & J < \omega; \end{cases} \tag{41}$$

where $\omega = p+q-1$.

Figure 7:
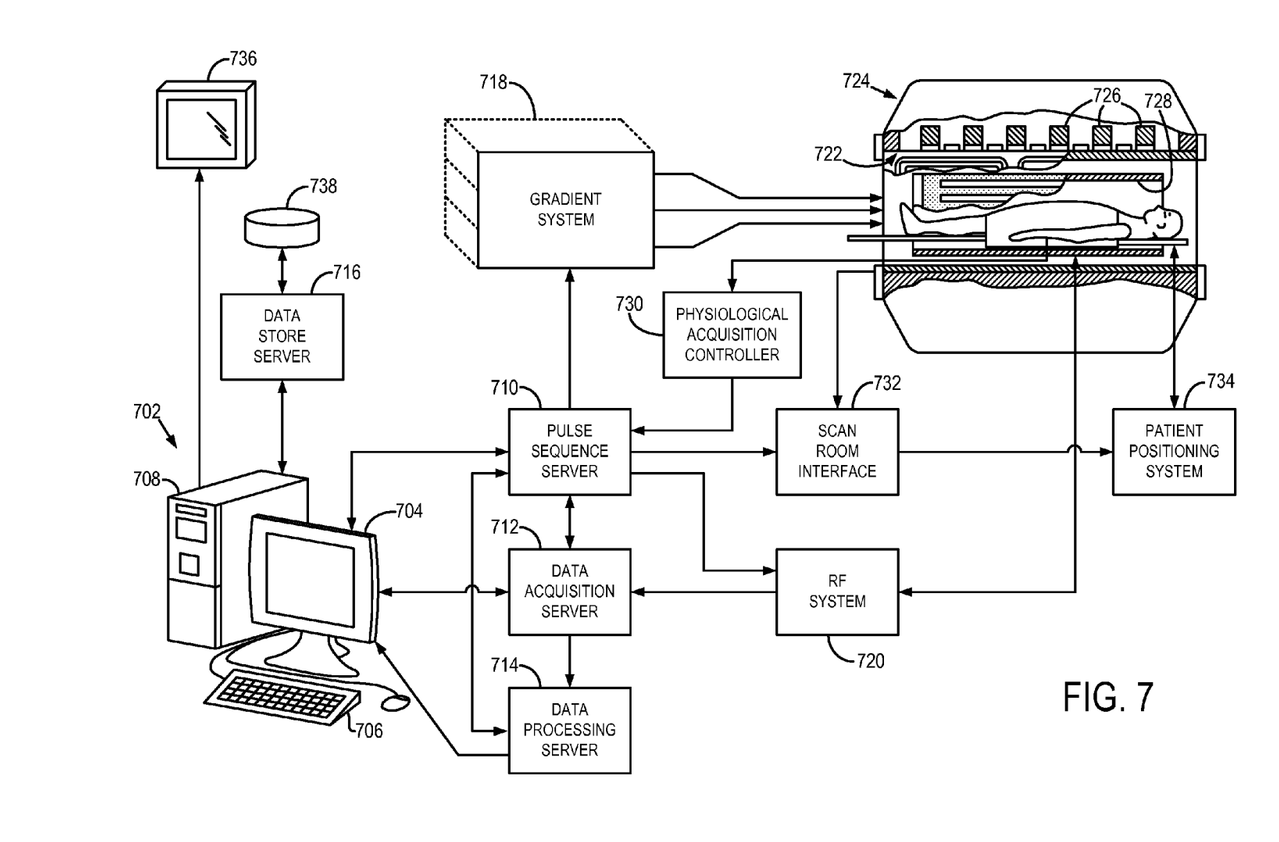
FIG. 7 is a block diagram of an exemplary magnetic resonance imaging ("MRI") system that may employ the present invention.

Referring particularly now to FIG. 7, an exemplary magnetic resonance imaging ("MRI") system 700 is illustrated. The MRI system 700 includes a workstation 702 having a display 704 and a keyboard 706. The workstation 702 includes a processor 708, such as a commercially available programmable machine running a commercially available operating system. The workstation 702 provides the operator interface that enables scan prescriptions to be entered into the MRI system 700. The processor 708 may also be configured to carry out the methods for generating and ordering points sets as described above in detail. The workstation 702 is coupled to four servers: a pulse sequence server 710; a data acquisition server 712; a data processing server 714, and a data store server 716. The workstation 702 and each server 710, 712, 714 and 716 are connected to communicate with each other and may, for example, communicate and utilize the results of the above-described methods for generating and ordering point sets.

The pulse sequence server 710 functions in response to instructions downloaded from the workstation 702 to operate a gradient system 718 and a radiofrequency ("RF") system 720. Gradient waveforms necessary to perform the prescribed scan are produced and applied to the gradient system 718, which excites gradient coils in an assembly 722 to produce the magnetic field gradients $G_x$, $G_y$, and $G_z$ used for position encoding MR signals. The gradient coil assembly 722 forms part of a magnet assembly 724 that includes a polarizing magnet 726 and a whole-body RF coil 728.

RF excitation waveforms are applied to the RF coil 728, or a separate local coil (not shown in FIG. 7), by the RF system 720 to perform the prescribed magnetic resonance pulse sequence. Responsive MR signals detected by the RF coil 728, or a separate local coil (not shown in FIG. 7), are received by the RF system 720, amplified, demodulated, filtered, and digitized under direction of commands produced by the pulse sequence server 710. The RF system 720 includes an RF transmitter for producing a wide variety of RF pulses used in MR pulse sequences. The RF transmitter is responsive to the scan prescription and direction from the pulse sequence server 710 to produce RF pulses of the desired frequency, phase, and pulse amplitude waveform. The generated RF pulses may be applied to the whole body RF coil 728 or to one or more local coils or coil arrays (not shown in FIG. 7).

The RF system 720 also includes one or more RF receiver channels. Each RF receiver channel includes an RF amplifier that amplifies the MR signal received by the coil 728 to which it is connected, and a detector that detects and digitizes the I and Q quadrature components of the received MR signal. The magnitude of the received MR signal may thus be determined at any sampled point by the square root of the sum of the squares of the I and Q components:

$$M = \sqrt{I^2 + Q^2} \tag{42}$$

and the phase of the received MR signal may also be determined:

$$\varphi = \tan^{-1}\left(\frac{Q}{I}\right). \tag{43}$$

The pulse sequence server 710 also optionally receives patient data from a physiological acquisition controller 730. The controller 730 receives signals from a number of different sensors connected to the patient, such as electrocardiograph ("ECG") signals from electrodes, or respiratory signals from a bellows or other respiratory monitoring device. Such signals are typically used by the pulse sequence server 710 to synchronize, or "gate," the performance of the scan with the subject's heart beat or respiration.

The pulse sequence server 710 also connects to a scan room interface circuit 732 that receives signals from various sensors associated with the condition of the patient and the magnet system. It is also through the scan room interface circuit 732 that a patient positioning system 734 receives commands to move the patient to desired positions during the scan.

The digitized MR signal samples produced by the RF system 720 are received by the data acquisition server 712. The data acquisition server 712 operates in response to instructions downloaded from the workstation 702 to receive the real-time MR data and provide buffer storage, such that no data is lost by data overrun. In some scans, the data acquisition server 712 does little more than pass the acquired MR data to the data processor server 714. However, in scans that require information derived from acquired MR data to control the further performance of the scan, the data acquisition server 712 is programmed to produce such information and convey it to the pulse sequence server 710. For example, during prescans, MR data is acquired and used to calibrate the pulse sequence performed by the pulse sequence server 710. Also, navigator signals may be acquired during a scan and used to adjust the operating parameters of the RF system 720 or the gradient system 718, or to control the view order in which k-space is sampled. The data acquisition server 712 may also be employed to process MR signals used to detect the arrival of contrast agent in a magnetic resonance angiography ("MRA") scan. In all these examples, the data acquisition server 712 acquires MR data and processes it in real-time to produce information that is used to control the scan.

The data processing server 714 receives MR data from the data acquisition server 712 and processes it in accordance with instructions downloaded from the workstation 702. Such processing may include, for example: Fourier transformation of raw k-space MR data to produce two or three-dimensional images; the application of filters to a reconstructed image; the performance of a backprojection image reconstruction of acquired MR data; the generation of functional MR images; and the calculation of motion or flow images.

Images reconstructed by the data processing server 714 are conveyed back to the workstation 702 where they are stored. Real-time images are stored in a data base memory cache (not shown in FIG. 7), from which they may be output to operator display 712 or a display 736 that is located near the magnet assembly 724 for use by attending physicians. Batch mode images or selected real time images are stored in a host database on disc storage 738. When such images have been reconstructed and transferred to storage, the data processing server 714 notifies the data store server 716 on the workstation 702. The workstation 702 may be used by an operator to archive the images, produce films, or send the images via a network to other facilities.

The present invention has been described in terms of one or more preferred embodiments, and it should be appreciated that many equivalents, alternatives, variations, and modifications, aside from those expressly stated, are possible and within the scope of the invention.

The invention claimed is:

1. A medical imaging system comprising:
a processor configured to:
generate a point set that defines magnetic resonance imaging acquisition parameters, the point set including points that are substantially uniformly distributed on a surface of a sphere;
determine an order in which points in the generated point set are to be temporally arranged by minimizing electrostatic energy potentials related to the points in the generated point set; and
a magnetic resonance imaging system configured to acquire magnetic resonance image data, the magnetic resonance imaging system being in communication with the processor so as to receive therefrom the generated point set and the determined order in which points in the generated point set are to be temporally arranged, and being configured to acquire magnetic resonance image data in accordance with the magnetic resonance imaging acquisition parameters defined by the generated point set and the determined order in which points in the generated point set are to be temporally arranged.

2. The medical imaging system as recited in claim 1 in which the magnetic resonance imaging acquisition parameters include at least one of a k-space trajectory and a diffusion-weighting direction.

3. The medical imaging system as recited in claim 2 in which the k-space trajectory is a three-dimensional radial k-space trajectory.

4. The medical imaging system as recited in claim 3 in which the processor is further configured to determine the order in which points in the generated point set are to be temporally arranged by:
   i) forming a point set grid matrix using the generated point set;
   ii) estimating a substantially maximal electrostatic energy potential for each row in the point grid matrix;
   iii) estimating a substantially maximal electrostatic energy potential for each column in the point grid matrix; and iv) searching for lower energy configurations of the point set grid matrix by swapping locations of points in the point set grid matrix with points corresponding to the estimated substantially maximal electrostatic energy potentials.

5. The medical imaging system as recited in claim 1 in which the magnetic resonance imaging acquisition parameters include diffusion-weighting directions, and the processor is configured to generate a point set that is antipodally symmetric.

6. The medical imaging system as recited in claim 5 in which the processor is further configured to determine the order in which the points in the generated point set are to be temporally arranged by taking into consideration a uniformity of a spatial distribution of the diffusion-weighting directions with respect to time.

7. The medical imaging system as recited in claim 5 in which the diffusion-weighting directions correspond to diffusion-weighting values having different b-values, and the processor is further configured to determine the order in which the points in the generated point set are to be temporally arranged by taking into consideration the different b-values corresponding to the diffusion-weighting directions.

8. The medical imaging system as recited in claim 5 in which the processor is further configured to generate the antipodally symmetric point set by:
   i) selecting a number of desired points on a hemisphere of the surface of the sphere;
   ii) estimating a number of latitudes on the hemisphere; and
   iii) determining the number of points in each of the estimated number of latitudes.

9. The medical imaging system as recited in claim 5 in which the processor is further configured to determine the order in which points in the generated point set are to be temporally arranged by:
   i) selecting an initial pair of points from the generated point set;
   ii) forming a point set array that includes as its first term, the initial pair of points, and that includes as its other terms, other pairs of points in the generated point set having added thereto an electrostatic energy potential cross-terms related to the respective other pairs of points;
   iii) identifying a lowest energy term in the formed point set array;
   iv) updating the formed point set array by setting its second term as the lowest energy term identified in step iii);
   v) iteratively updating the point set array by adding cross-terms to successive terms of the point set array, identifying the lowest energy term in the point set array, and setting the next unassigned term in the point set array as the identified lowest energy term.

10. A method for producing an image of a subject with a magnetic resonance imaging (MRI) system, the steps of the method comprising:
   a) determining MRI acquisition parameters by:
      a)i) generating a point set that defines the MRI acquisition parameters, the point set including points that are substantially uniformly distributed on a surface of a sphere;
      a)ii) determining an order in which points in the point set generated in step a)i) are to be temporally arranged by minimizing electrostatic energy potentials related to the points in the point set generated in step a)ii);
   b) directing the MRI system to acquire k-space data from a subject using the MRI acquisition parameters determined in step a) and the order in which points in the point set generated in step a)i) are to be temporally arranged, as determined in step a)ii); and
   c) reconstructing an image of the subject from the k-space data acquired in step b).

11. The method as recited in claim 10 in which the MRI acquisition parameters determined in step a) include at least one of a k-space trajectory and a diffusion-weighting gradient direction.

12. The method as recited in claim 11 in which the k-space trajectory is a three-dimensional radial k-space trajectory.

13. The method as recited in claim 12 in which step a)i) includes:
   forming a point set grid matrix using the generated point set;
   estimating a substantially maximal electrostatic energy potential for each row in the point grid matrix;
   estimating a substantially maximal electrostatic energy potential for each column in the point grid matrix; and
   searching for lower energy configurations of the point set grid matrix by swapping locations of points in the point set grid matrix with points corresponding to the estimated substantially maximal electrostatic energy potentials.

14. The method as recited in claim 10 in which the MRI acquisition parameters include diffusion-weighting directions, and in which the point set generated in step a)i) is antipodally symmetric.

15. The method as recited in claim 14 in which step a)ii) includes taking into consideration a uniformity of a spatial distribution of the diffusion-weighting directions with respect to time.

16. The method as recited in claim 14 in which the diffusion-weighting directions correspond to diffusion-weighting values having different b-values, and in which step a)ii) includes taking into consideration the different b-values corresponding to the diffusion-weighting directions.

17. The method as recited in claim 14 in which step a)i) includes:
   selecting a number of desired points on a hemisphere of the surface of the sphere;
   estimating a number of latitudes on the hemisphere; and
   determining the number of points in each of the estimated number of latitudes.

18. The method as recited in claim 14 in which step a)ii) includes:
   selecting an initial pair of points from the generated point set;
   forming a point set array that includes as its first term, the initial pair of points, and that includes as its other terms, other pairs of points in the generated point set having added thereto an electrostatic energy potential cross-terms related to the respective other pairs of points;
   identifying a lowest energy term in the formed point set array;
   updating the formed point set array by setting its second term as the identified lowest energy term; and
   iteratively updating the point set array by adding cross-terms to successive terms of the point set array, identifying the lowest energy term in the point set array, and setting the next unassigned term in the point set array as the identified lowest energy term.

* * * * *